United States Patent

Ha

[11] Patent Number: 5,852,580
[45] Date of Patent: Dec. 22, 1998

[54] REPAIR FUSE CIRCUIT IN A FLASH MEMORY DEVICE

[75] Inventor: Chang Wan Ha, Kyungki-Do, Rep. of Korea

[73] Assignee: Hyundai Electronics Industries Co., Ltd., Kyungki-Do, Rep. of Korea

[21] Appl. No.: 999,350

[22] Filed: Dec. 29, 1997

[30] Foreign Application Priority Data

Dec. 28, 1996 [KR] Rep. of Korea .................. 1996 74984

[51] Int. Cl.⁶ ...................................................... G11C 7/00
[52] U.S. Cl. .................. 365/200; 365/225.7; 365/230.08
[58] Field of Search ................................ 365/200, 225.7, 365/230.08, 189.05, 189.07

[56] References Cited

U.S. PATENT DOCUMENTS 5,200,922 4/1993 Rao .
5,550,394 8/1996 Sukegawa et al. ..................... 365/200
5,677,882 10/1997 Isa et al. ................................. 365/200

*Primary Examiner*—Vu A. Le
*Attorney, Agent, or Firm*—Scott C. Harris, Esq.

[57] ABSTRACT

The repair fuse circuit of the present invention comprises a power-on reset circuit to generate first and second control signals in response to a reset pulse which is generated upon power-on; a delay circuit to generate second and fourth control signals which are delayed according to the first control signal; a gate voltage control circuit to generate a fifth control signal which is delayed according to the third control signal; a reference voltage generating circuit to generate a reference voltage in response to the fourth control signal; a fuse cell sensing and latching circuit to latch a data stored on a fuse cell in response to the fifth control signal; and an address compare circuit to generate a redundant address by comparing an output of the fuse cell sensing and latching circuit with a normal address.

2 Claims, 3 Drawing Sheets

REPAIR FUSE CIRCUIT IN A FLASH MEMORY DEVICE

FIELD OF THE INVENTION

1. Field of the Invention

The present invention relates to a repair fuse circuit in a flash memory device. In particular, the present invention relates to a repair fuse circuit in a flash memory device which can reduce current upon a read operation by reading and latching a data stored on a fuse cell upon a power-on.

2. Description of the Prior Art

Generally, a bias condition of a program, erase and read operation of a stack gate type flash memory cell can be given as following Table 1.

|  | PROGRAM | ERASE | READ |
|---|---|---|---|
| DRAIN | 3~7 V | floating | 1 V |
| GATE | 8~11 V | −8~−11 V | 3~5 V |
| SOURCE | 0 V | 3~5 V | 0 V |
| MECHANISM | channel hot electron injection | F–N tunneling |  |

In order to repair a defect cell, a fuse cell is required to store an address of the defect cell. FIG. 1 shows a conventional repair circuit in a flash memory device. A a conventional repair circuit as shown in FIG. 1 has a disadvantage that since it verifies the state of a fuse cell by means of a chip select signal, the time to verify the fuse cell is required after the chip select signal is enabled and thus a chip enable access time is delayed. In addition, it has an additional disadvantage that a spontaneous voltage upon sensing of the cell is increased since sensing of a cell is accomplished by a chip select signal.

SUMMARY OF THE INVENTION

It is an object of the present invention to provide a repair fuse circuit in a flash memory device which can reduce increase of current upon a read operation by reading and latching fuse cells upon a power-on.

To achieve the above object, the repair fuse circuit in the flash memory device according to the present invention comprises a power-on reset circuit to generate first and second control signals in response to a reset pulse which is generated upon power-on; a delay circuit to generate second and fourth control signals which are delayed according to the first control signal; a gate voltage control circuit to generate a fifth control signal which is delayed according to the third control signal; a reference voltage generating circuit to generate a reference voltage in response to the fourth control signal; a fuse cell sensing and latching circuit to latch a data stored on a fuse cell in response to the fifth control signal; and an address compare circuit to generate a redundant address by comparing an output of the fuse cell sensing and latching circuit with a normal address. The fuse cell sensing and latching circuit comprises a fuse cell having both functions of program and erasure; a latch circuit to latch a data stored on the fuse cell; and a means for initializing the latch circuit upon power-on.

BRIEF DESCRIPTION OF THE DRAWINGS

Other objects and advantages of the present invention will be understood by the detailed explanation of the embodiment with reference to the accompanying drawings in which.

DETAILED DESCRIPTION OF THE DRAWINGS

Below, the preferred embodiment of the present invention will be in detail explained by reference to the accompanying drawings.

Figure 1:
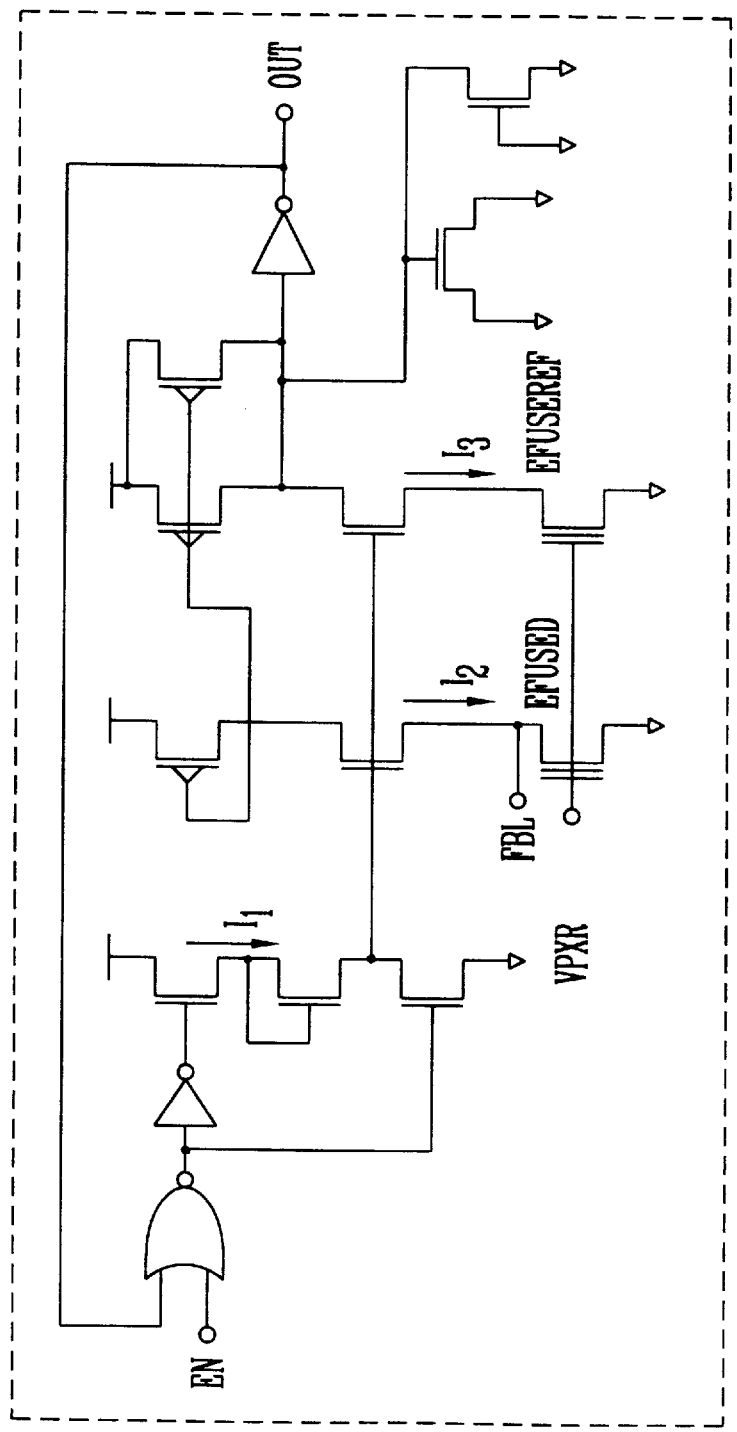
FIG. 1 shows a conventional repair fuse circuit of a flash memory device.
Figure 2:
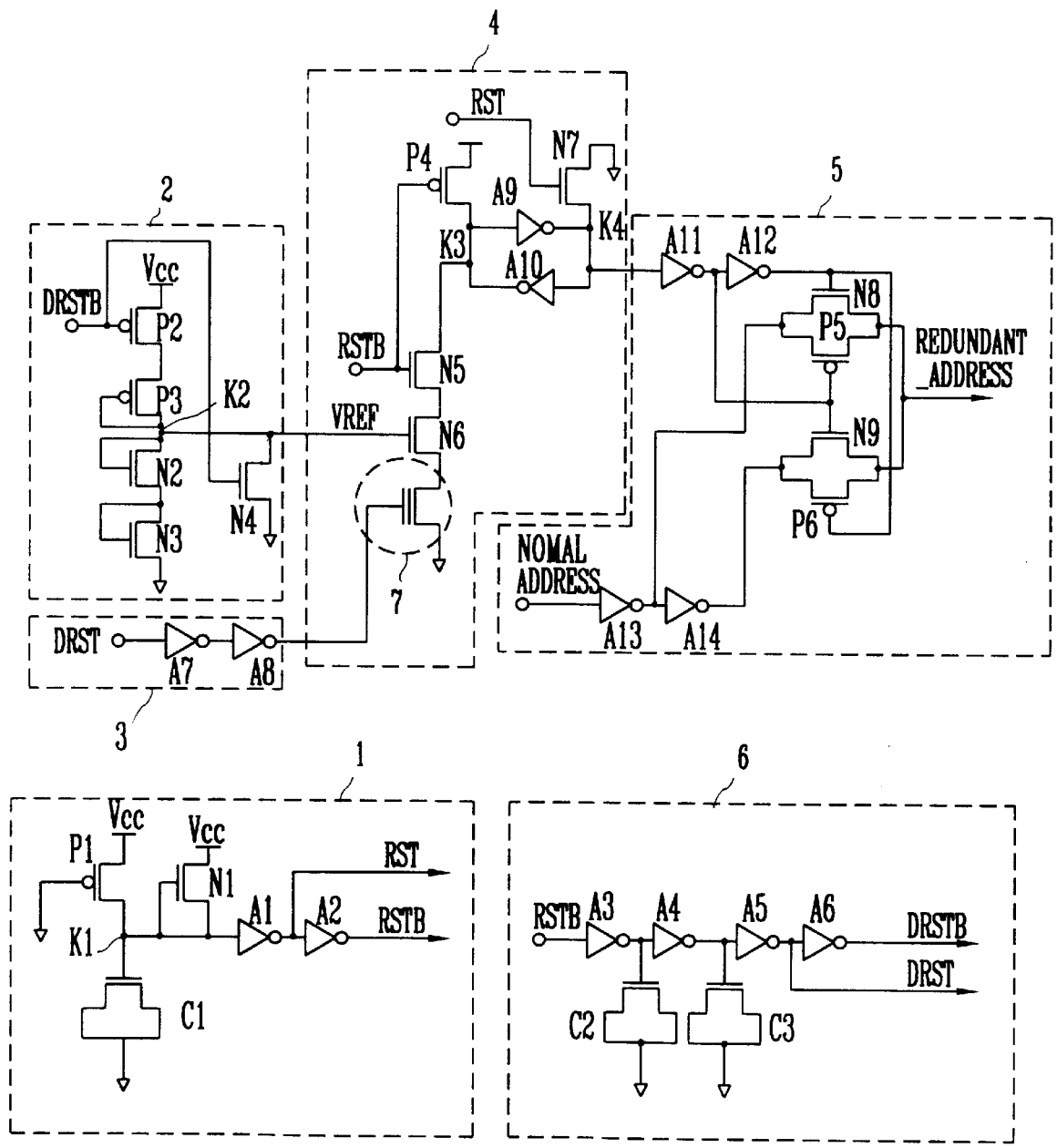
FIG. 2 shows a repair fuse circuit according to the present invention.

FIG. 2 shows a repair fuse circuit in a flash memory device according the present invention.

The repair fuse circuit according to the present invention comprises a power-on reset circuit 1, a reference voltage generating circuit 2, a gate voltage control circuit 3, a fuse cell sensing and latching circuit 4, an address compare circuit 5 and delay circuit 6. FIG. 2 will be described with reference to FIG. 3.

The power-on reset circuit 1 has a PMOS transistor P1, a capacitor C1, a NMOS transistor N1, and inverters A1 and A2. Upon power-on, a node K1 becomes a zero potential. An output RST of the inverter A1 becomes a high level, while an output RSTB of the inverter A2 becomes a low level.

The output RST of the inverter A1 is supplied to a gate electrode of an NMOS transistor N7 in the fuse cell sensing and latching circuit 4. The output RSTB of the inverter A2 is supplied to an input terminal of an inverter A3 in the delay circuit 6 and a gate electrode of an NMOS transistor N5 in the fuse cell sensing and latching circuit 4.

The delay circuit 6 comprises inverters A3, A4, A5 and A6, and capacitors C2 and C3. An output DRST of the inverter A5 is a high level while an output DRSTB of the inverter A6 is a low level. The output DRST of the inverter A5 is supplied to an input terminal of an inverter A7 in the gate voltage control circuit 3, and the output DRSTB of the inverter A6 is supplied to a gate electrode of a PMOS transistor P2 in the reference voltage generating circuit 2.

The reference voltage generating circuit 2 has PMOS transistors P2 and P3, and NMOS transistors N2, N3 and N4. A node K2 maintains a reference voltage $V_{REF}$. This reference voltage $V_{REF}$ is supplied to a gate electrode of an NMOS transistor in the fuse cell sensing and latching circuit 4.

The NMOS transistor N7 and the PMOS transistor P4 in the fuse cell sensing and latching circuit 4 are turned on in response the outputs RST and RSTB of the power-on reset circuit 1, whereby the nodes K3 and K4 are initialized to a high level and low level, respectively.

Figure 3:
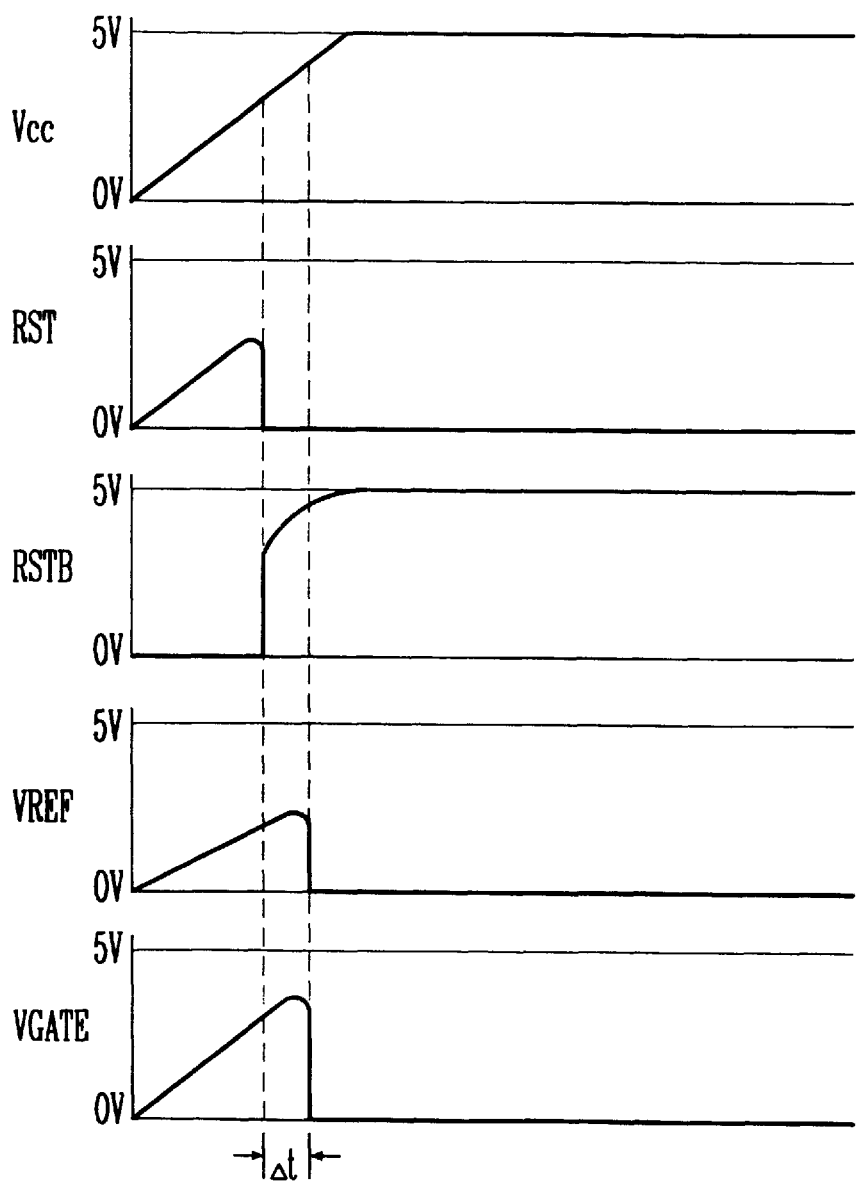
FIG. 3 shows input and output waveforms of FIG. 2.

When an output of the gate voltage control circuit 3 and the output RSTB become a high level while the output RST becomes a low level, a date stored on a fuse cell 7 is output. For example, when the fuse cell 7 is programmed, the node K3 maintains a high level while the node K4 maintains a low level. As shown in FIG. 3, the above operation is performed before a supply voltage Vcc reaches at a desired level. That is, the operation is performed as soon as the supply voltage Vcc is supplied.

The address compares circuit 5 comprises inverters A11, A12, A13 and A14, PMOS transistors P5 and P6, and NMOS transistors N8 and N9.

For example, when the node K4 maintains a low level and a normal address maintains a high level, the transistor N9 and P6 are turned, whereby an redundant address maintains a high level.

As described above, the present invention provides an outstanding effect that it can reduce current upon a read operation by reading and latching fuse cells upon a power-on.

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A repair fuse circuit in a flash memory device, comprising;

a power-on reset circuit to generate first and second control signals in response to a reset pulse which is generated upon power-on;

a delay circuit to generate third and fourth control signals which are delayed according to said first control signal;

a gate voltage control circuit to generate a fifth control signal which is delayed according to said third control signal;

a reference voltage generating circuit to generate a reference voltage in response to said fourth control signal;

a fuse cell sensing and latching circuit to latch a data stored on a fuse cell in response to said fifth control signal, wherein said fuse cell sensing and latching circuit is initialized by said first and second control signals before the data is latched; and an address compare circuit to generate a redundant address by comparing an output of said fuse cell sensing and latching circuit with a normal address.

2. The circuit of claim 1, wherein said fuse cell sensing and latching circuit comprises a fuse cell having both functions of program and erasure, a latch circuit to latch a data stored on said fuse cell and a means for initializing said latch circuit upon power-on.

* * * * *